United States Patent [19]

Ackerman et al.

[11] Patent Number: 4,996,481
[45] Date of Patent: Feb. 26, 1991

[54] MAGNETIC RESONANCE RF PROBE WITH ELECTROMAGNETICALLY ISOLATED TRANSMITTER AND RECEIVER COILS

[75] Inventors: Joseph J. H. Ackerman; Wei Chen, both of St. Louis, Mo.

[73] Assignee: Washington University, St. Louis, Mo.

[21] Appl. No.: 390,176

[22] Filed: Aug. 7, 1989

[51] Int. Cl.⁵ ............................................. G01R 33/30
[52] U.S. Cl. ..................................... 324/318; 324/322
[58] Field of Search ................. 324/95, 117, 127, 241, 324/301, 302, 318, 322, 329; 128/653 R, 653 SC; 600/11; 343/742, 867

[56] References Cited

U.S. PATENT DOCUMENTS

| | | | |
|---|---|---|---|
| 2,220,070 | 11/1940 | Aiken | 324/329 |
| 2,451,596 | 10/1948 | Wheeler | 324/329 |
| 3,826,973 | 7/1974 | Pflaum | 324/329 |
| 4,093,910 | 6/1978 | Hill | 324/322 |
| 4,620,155 | 10/1986 | Edelstein | 324/322 |
| 4,636,730 | 1/1987 | Bottomley | 324/322 |
| 4,887,039 | 12/1989 | Roemer et al. | 324/322 |

OTHER PUBLICATIONS

Article from the *Journal of Magnetic Resonance*, 64, 20-31, (1985), by Crowley, Evelhoch, and Ackerman entitled "The Surface-Coil NMR Receiver in the Presence of Homogenous $B_1$ Excitation".
Article from *Magnetic Resonance in Medicine* 3, 590-603, (1986), by Froncisz, Jesmanowicz, Kneeland, and Hyde entitled "Counter Rotating Current Local Coils for High-Resolution Magnetic Resonance Imaging".
Article from *Magnetic Resonance in Medicine* 2, 402-409, (1985), by Styles, Scott, and Radda entitled "A Method for Localizing High-Resolution NMR Spectra from Human Subjects".
Article by Hyde, Froncisz, Jesmanowicz, and Kneeland entitled "Planar-Pair Local Coils for High-Resolution Magnetic Resonance Imaging, Particularly of the Temporomandibular Joint", Medical Physics, 13, (1986).
Article from the *Journal of Magnetic Resonance* 70, 512-517, (1986), by Hyde, Jesmanowicz, Froncisz, Kneeland, and Grist entitled "Parallel Image Acquisition from Noninteracting Local Coils".
Article from the *Bulletin of Magnetic Resonance*, Oct. 1986, by Bendall entitled "Surface Coil Techniques for in Vivo NMR".

Primary Examiner—Hezron E. Williams
Assistant Examiner—Kevin D. O'Shea
Attorney, Agent, or Firm—Rogers, Howell & Haferkamp

[57] ABSTRACT

An RF probe for use in magnetic resonance applications includes a transmitter coil for transmitting RF energy to excite a specimen and a receiver coil for sensing the RF energy absorbed or emitted by the specimen wherein the receiver coil is electrically decoupled from the transmitter coil through the geometrical shape and positioning of the receiver coil with respect to the transmitter coil. Both the transmitter and receiver coils are used to produce well defined RF magnetic fields. The technique includes the concept of physically locating multiple elements of either a transmitter or receiver coil such that the net current induced in the receiver coil is equal to zero. This technique is achieved in a frequency independent manner without orthogonally aligning the receiver coil with the transmitter coil, the coils being suitable for co-axial alignment as well as other alignments, much akin to prior art probes and thus readily adaptable to exisiting devices and protocols.

32 Claims, 3 Drawing Sheets

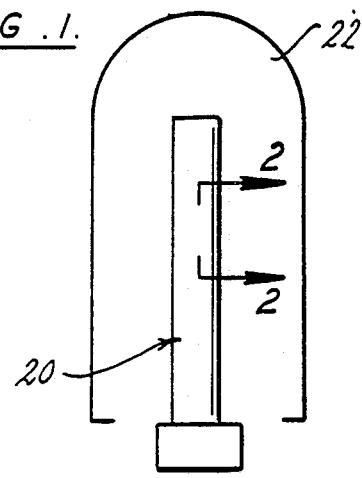
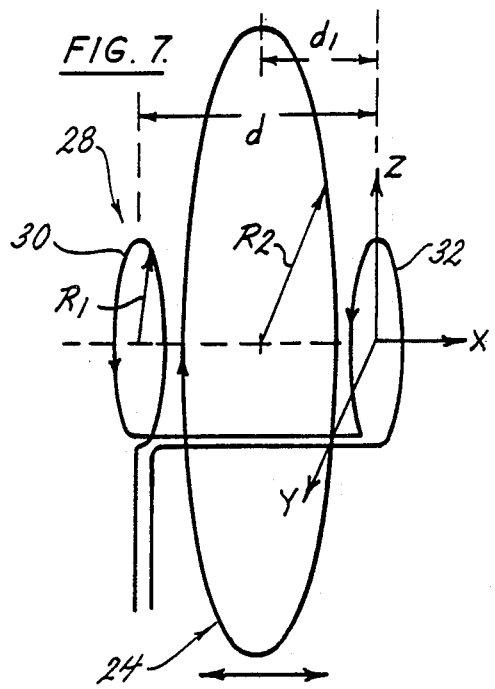
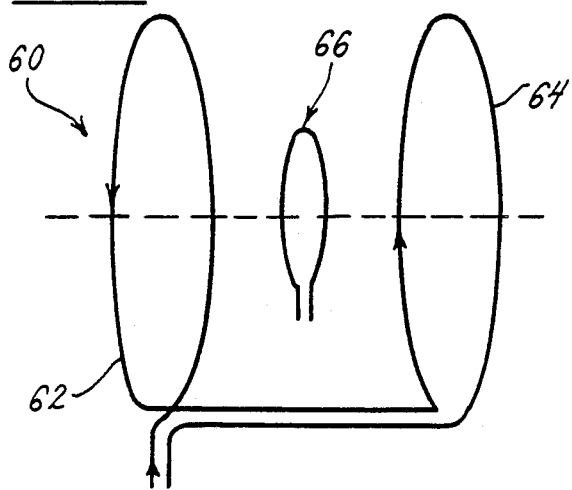
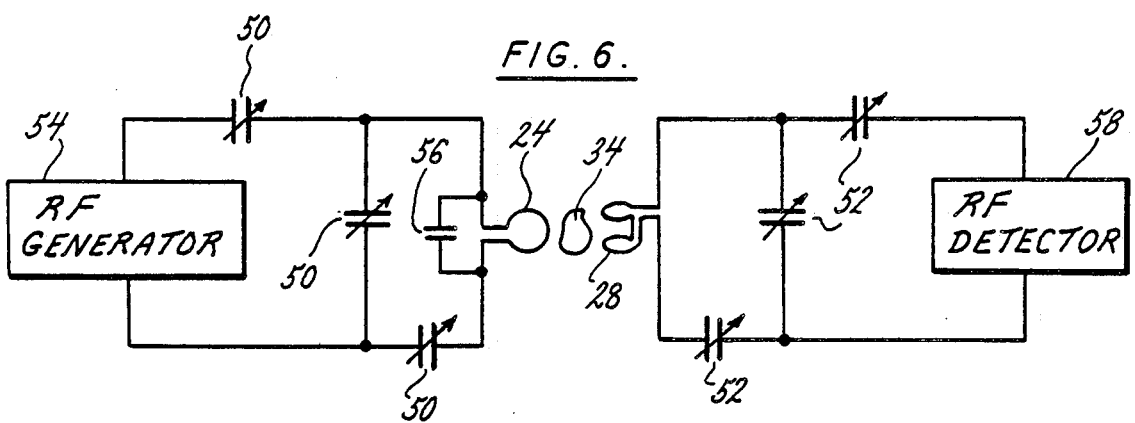

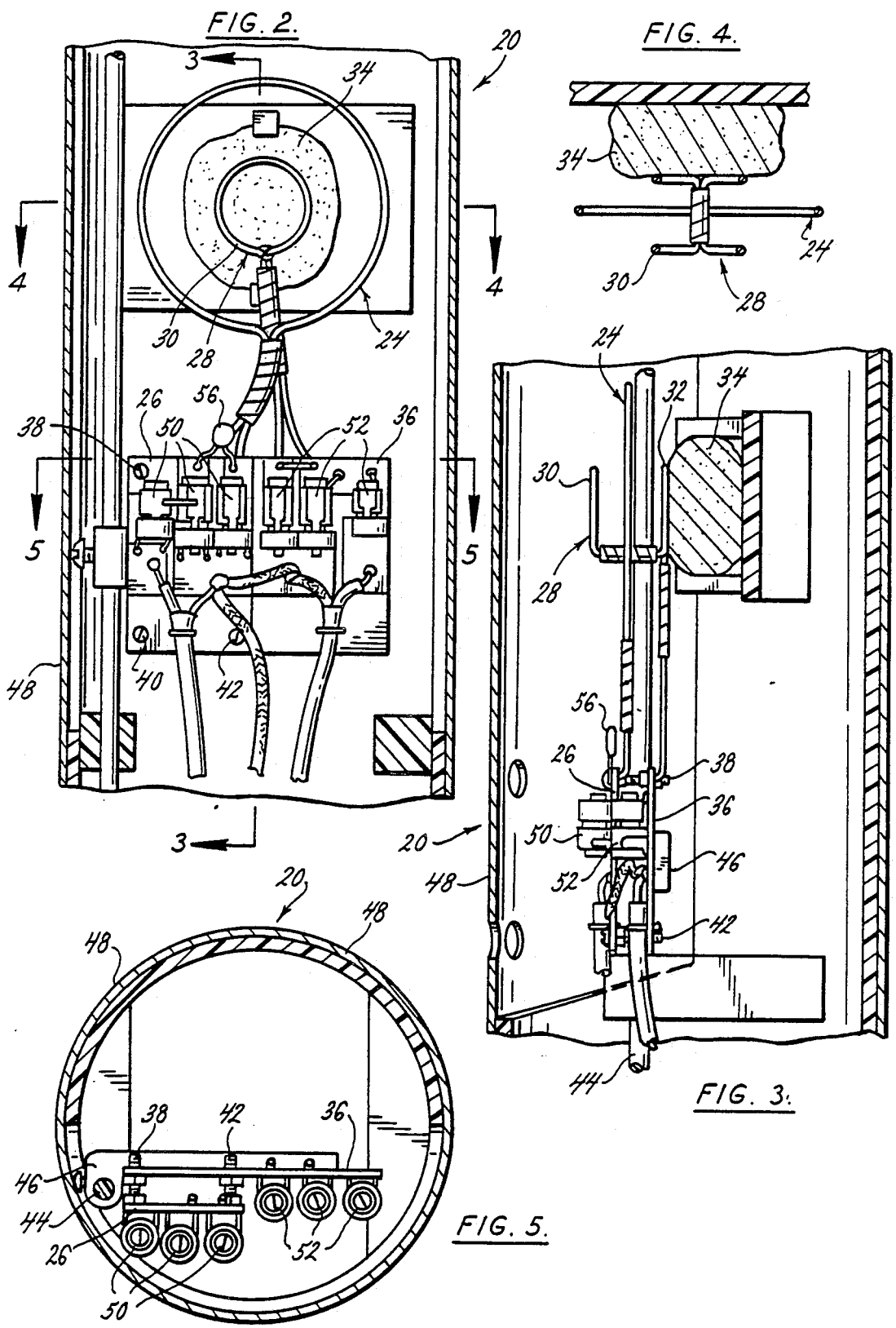

MAGNETIC RESONANCE RF PROBE WITH ELECTROMAGNETICALLY ISOLATED TRANSMITTER AND RECEIVER COILS

BACKGROUND AND SUMMARY OF THE INVENTION

The technique for chemically analyzing living tissue through nuclear magnetic resonance (NMR) phenomena is well known and essentially includes locating a tissue sample and a transmitter/receiver probe within a strong magnetic field, and using the probe to excite the tissue with RF energy and measure the frequency and strength of the RF energy absorbed or emitted by the tissue. One type of probe used in such magnetic resonance analysis includes multiple antenna surface-coil probes generally comprised of a larger outer circular coil employed as a transmitter and a smaller inner circular coil employed as a receiver. These probes are useful in proton decoupled carbon-13 NMR, DEPTH pulse sequence spatial focusing, Fourier series spatial windowing and one-dimensional rotating frame Zeugmatography. For simplicity, reference will be made solely to the multiple antenna surface-coil NMR probes in one of these applications while it shall be understood that other applications are similarly suitable for similar types of probe designs.

With multiple antenna surface-coil NMR probes, the primary technical problem in the prior art has been the electromagnetic coupling between the two coils. The magnetic field produced by the RF energy driving the transmitter or larger coil has a tendency to induce an RF current in the smaller receiver coil that generates an opposing electromagnetic field which distorts the distribution of RF energy, the magnetic field pattern, of the larger transmitter coil. In a similar, although much less marked manner, the small receiver coil can be thought of as also inducing current in the large transmitter coil. This effect is especially severe when both coils are tuned to the same operating frequency and are co-axially oriented. While this coupling between coils may be measured and adjusted for, it is undesirable in that it generally dramatically degrades the frequency and impedance tuning of the transmitter/receiver electrical circuit, perturbs the desired characteristic of each antenna, complicates the analysis required to interpret the results, and also is an unwanted variable which reduces the accuracy of the data collected.

In the prior art, a number of methods have been developed and utilized for reducing the coupling between coils in a multiple antenna surface-coil probe. These methods typically employ quarter wavelength co-axial transmission lines and/or crossed diodes. Although advances in such coil-to-coil decoupling techniques have yielded improved isolation and workable co-axial surface-coil probe designs, operational problems remain. Non-idealities of transmission lines and diodes lower the antenna circuit quality factor (Q) of the coils. Furthermore, proper adjustment of quarter wavelength cable length and placement in the circuit are non-trivial due to the cable size and required cable change for change in operating frequency. With crossed diodes, separate tuning and matching of each coil requires (ideally) sufficient RF current to short circuit the diodes.

To solve these and other problems in the prior art, the inventors have succeeded in designing and developing a co-axial multiple antenna surfacecoil NMR probe which utilizes typically a larger circular loop for the transmitter coil and a smaller receiver coil consisting of not one but two circular loop elements wound in the opposite direction, the elements being oriented generally symmetrically about the transmitter loop. Therefore, with the transmitter coil located midway between the two opposed loops comprising the receiver coil, the transmitter magnetic field can be thought of as inducing currents in the two loops of the receiver coil of the same strength but in opposite directions in the single conductor. This results in a net induced current in the receiver coil of substantially zero such that there is no magnetic field produced corresponding to an induced current to disturb the field distribution pattern of the transmitter coil. Furthermore, the second loop added to the typical single loop receiver coil does not enter into the detection operation of the receiver coil in that the second receiver coil loop is sufficiently far away from the sample that it can be ignored. In other words, the second receiver coil loop is beyond the sensitive volume of the sample region of the first receiver coil loop. Thus, the receiver antenna of the present invention becomes essentially equivalent to the single loop receiver antenna of the prior art that is typically positioned adjacent to the sample. The inventors have constructed a probe of the present invention which achieves isolation of greater than 40 db between the transmit and receive antennas, and believe that isolation of upwards of 50 db may be readily attained.

While there are many advantages and features of the present invention over the prior art, some of these include the fact that the inventors' device relies simply on the geometry of the receiver coil to achieve decoupling. With such an arrangement, standard, proven surface-coil designs may be readily utilized without alteration and without the difficulties experienced in the prior art of utilizing particular frequency dependent transmission line filters or diode elements. By utilizing standard proven surface-coil designs, well defined fields are guaranteed to be produced so as to optimize the results attainable from NMR techniques utilizing the present probe. Well defined fields are generally considered as being fields over the region of interest which are homogeneous, exhibit a linear gradient, or which produce typical and well documented field patterns for well known surface-coil type designs, e.g., circular or rectangular coils. Also, the inventors' design is frequency independent which provides maximum versatility for a probe.

Other embodiments of the present invention are also disclosed, including embodiments demonstrating asymmetrical receiver coil arrangements, dual element transmitter coils, and other non-orthogonal arrangements which also achieve the purposes of the present invention, i.e., that of decoupling the transmitter coil from the receiver coil in the NMR probe.

While the pricipal advantages and features of the present invention have been described above, a greater understanding and appreciation for the objects of the present invention may be attained by referring to the drawings and description of the preferred embodiment which follow.

BRIEF DESCRIPTION OF THE DRAWINGS

FIG. 1 is a schematic representation of the probe of the present invention oriented in a super conducting magnet;

FIG. 2 is a partial cross-sectional view taken along the plane of line 2—2 in FIG. 1 and detailing a front view of the transmitter and receiver coils as formed in a first embodiment of the present invention;

FIG. 3 is a partial cross-sectional view taken along the plane of line 3—3 in FIG. 2 and showing a side view of the transmitter and receiver coils in contact with a tissue sample inside the probe;

FIG. 4 is a partial cross-sectional view taken along the plane of line 4—4 in FIG. 2 and further detailing the receiver coil in direct contact with the tissue being examined;

FIG. 5 is a partial cross-sectional view taken along the plane of line 5—5 in FIG. 2 and detailing the mounting platform arrangement between the transmitter coil and receiver coil;

FIG. 6 is a schematic representation of the electrical circuit generally describing the operation of a typical probe;

FIG. 7 is a schematic representation of the electrical circuit comprising the transmitter and receiver coils of the first embodiment;

FIG. 8 is a schematic representation of the electrical schematic comprising a second embodiment of the present invention wherein the transmitter coil is comprised of a pair of elements;

DETAILED DESCRIPTION OF THE PREFERRED EMBODIMENT

Figure 9:
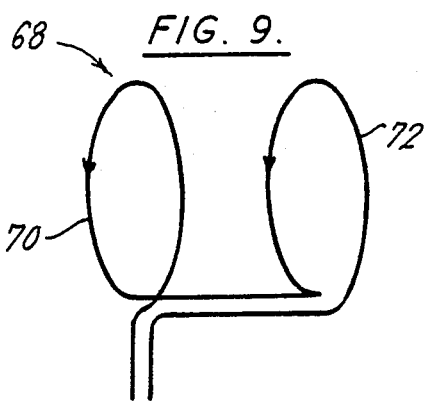
FIG. 9 is a schematic representation of the electrical schematic of a third embodiment of the present invention comprising a receiver coil with a pair of elements located within a homogeneous magnetic field.

As shown in FIG. 1, a probe 20 is commonly used in magnetic resonance research and analysis by placing it within a super conducting magnet 22 or the like which produces a high static homogeneous magnetic field. The probe 20 is shown in greater detail in FIGS. 2-5 and includes a transmitter coil 24 which is formed from a single conductor into a generally circular configuration and mounted to a PC board 26. A receiver coil 28 is similarly formed from a single conductor and is comprised of a pair 30, 32 of generally circular elements or inductive, near field radiators which are disposed on opposite sides of the transmitter coil 24, with one of the elements 32 being placed adjacent the tissue sample 34 for analysis purposes, as is well known in the art. The receiver coil 28 is itself mounted to a PC board 36, with transmitter PC board 26 being adjustably mounted by three screw assemblies 38, 40, 42 to receiver coil PC board 36. Receiver coil PC board 36 is cantilever mounted from a support rod 44 by a stud and collar assembly 46, thereby positioning the entire RF probe assembly within a cylindrical tube or shell 48. Each of PC boards 26, 36 have three adjustable capacitors 50, 52 for adjusting the RF response of its associated coil 24, 28.

A typical connection diagram for the probe 20 is shown in FIG. 6 and includes an RF generator 54 for supplying RF energy to the transmitter coil 24 with the three adjustable capacitors 50 along with a fixed capacitor 56 for adjusting the RF performance of the transmitter coil 24. A tissue sample 34 is thus bombarded with RF energy from the transmitter coil 24 and the receiver coil 28 detects the RF energy absorbed or emitted by the tissue 34 in response to the energy pulsed into the tissue sample 34 by transmitter coil 24. Similarly, tuning capacitors 52 peak the performance of receiver coil 28 such that the RF detector 58 senses the desired RF energy response. The protocol of NMR experimentation and analysis is well known in the art and is generally comprised of a number of different techniques, the details of which are unimportant for purposes of understanding the present invention, except to realize that the present invention is useful in many of these well known techniques and may be used with samples other than tissues, e.g., inert solids and liquids.

An electrical schematic is shown in FIG. 7 which corresponds to the physical embodiment explained in detail in FIGS. 2-5 and includes a centrally located, generally circularly formed transmitter coil 24 comprised of a single loop of conductor. The receiver coil 28 is generally comprised of a first, generally circular, loop 30 of conductor wound in a first direction as well as a second, generally circular, loop 32 of single conductor wound in an opposite direction and spaced symmetrically about the transmitter coil 24 and generally co-axial therewith. In order to achieve the purposes of the present invention, it is only necessary that the current induced in loop 30 is equal but opposite to the current otherwise induced in loop 32 such that there is no net current induced in receiver coil 28 by the energy transmitted from transmitter coil 24. Thus, receiver coil 28 is decoupled or electrically isolated from transmitter coil 24 such that the RF energy sensed by receiver coil 28 is a result only of that which is emitted from the tissue sample 34. Furthermore, the field generated by transmitter coil 24 is not affected by the presence of receiver coil 28 such that a predictable and desired pulse of energy having a well defined distribution pattern is obtained. In order to ensure that there is no net current induced in receiver coil 28, one of ordinary skill in the art could easily develop variations of the particular embodiment shown in FIG. 7. All of these variations are included within the scope and teaching of the present invention, it only being necessary that the receiver coil 28 and transmitter coil 24 are oriented in a non-orthogonal manner, that the transmitter coil 24 produces a well defined magnetic field, and that there is no net current induced in receiver coil 28.

Of the many variations which are possible to the present invention, several have been considered as being particularly important and will hence be more specifically disclosed in the present invention. For example, one such arrangement is shown in FIG. 8 and includes a transmitter coil 60 comprised of a first loop 62 and a second loop 64 which are wound in opposite directions, with a receiver coil 66 oriented co-axially and at the point of symmetry between loops 62, 64. In the art of magnetic resonance, a transmitter coil arrangement as shown in FIG. 8 may be used to produce a magnetic field having a linear gradient (and thus well defined) and, as the receiver coil 66 is symmetrically placed about both elements of the transmitter coil, a net current equal to zero is induced in the receiver coil 66.

Still another variation of the present invention is shown in the third embodiment of FIG. 9. In that embodiment, a homogeneous magnetic field may be produced by any transmitter coil arrangement and, hence, is not shown in FIG. 9. However, the mere presence of a receiver coil 68 comprised of a first loop 70 wound in one direction and a second loop 72 wound in a second direction results in an induced current equal to zero. Thus, a receiver coil as shown in FIG. 9 may be used not only in connection with the transmitter coil as shown in the first embodiment, but may also be used with a transmitter coil producing a homogeneous magnetic field and located at any point within the probe.

Figure 10:
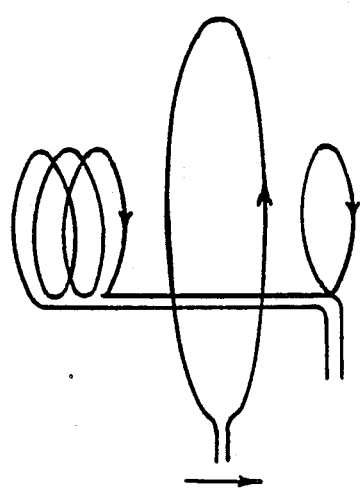
FIG. 10 is a schematic representation of the electrical schematic of a fourth embodiment of the present invention comprising a receiver coil with a pair of elements, one of said elements having more windings than the other.

As shown in FIG. 10, an asymmetric receiver coil arrangement can be used and still achieve the desired decoupling effect. One element of the receiver coil can consist of more turns than the other element. This permits an asymmetrical placement of the transmitter coil between the two receiver coils. This may be desirable in some applications as it permits selection of the physical location for the transmitter coil with respect to the detector coil element. Thus, the desired portion of the transmitter coil field may be used to excite the specimen. In the embodiment shown, one receiver coil element is comprised of a single loop, while the other has multiple loops. Different combinations of numbers of loops may be used in order to select a wide range of positions for the transmitter coil.

Figure 11:
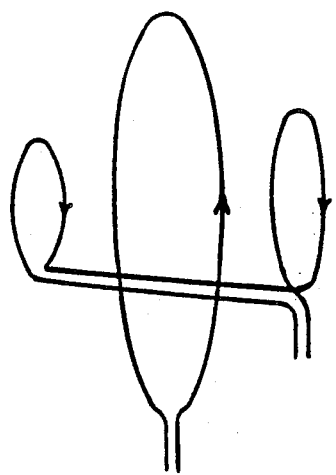
FIG. 11 is a schematic representation of the electrical schematic of a fifth embodiment of the present invention comprising a receiver coil with a pair of elements, one of said elements being larger than the other.

As shown in FIG. 11, another technique to achieve an asymmetric placement of the transmitter coil utilizes receiver coil loops of different diameters. By varying the relative diameters of the receiver coil elements, the location of the transmitter coil can be selected to be at a wide range of positions therebetween.

The probe may be tuned by physically adjusting the relative location, size, and number of loops of the coil elements so as to cancel out the induced current via electrical symmetry while still producing a well defined field. Therefore, the present invention encompasses coils having many shapes depending upon the other requirements of the probe and particular application involved.

There are various changes and modifications which may be made to the invention as would be apparent to those skilled in the art. However, these changes or modifications are included in the teaching of the disclosure, and it is intended that the invention be limited only by the scope of the claims appended hereto.

What is claimed is:

1. A probe for transmitting RF energy in an externally generated magnetic field and sensing a magnetic field induced in a sample by said transmitted RF energy, said probe comprising a transmitter coil and a receive coil mounted non-orthogonally thereto, each of said coils having a near field radiation pattern of a well defined RF magnetic field, and said coils having a specific geometric orientation such that no significant coupling occurs therebetween as the coils radiate in each other's field and in the presence of said sample.

2. The probe of claim 1 wherein one of said coils is comprised of at least two elements.

3. The probe of claim 2 wherein the receive is comprised of at least two elements and the net current induced in said two elements by the transmitter coil is substantially zero.

4. The probe of claim 3 wherein the said two elements are arranged substantially symmetrically about said transmitter coil.

5. The probe of claim 4 wherein said elements are substantially the same geometric size and shape.

6. The probe of claim 5 wherein said receiver coil is formed from a single length of conductor, and said elements are wound therefrom in opposite directions.

7. The probe of claim 6 wherein said receiver coil and transmitter coil are co-axial.

8. The probe of claim 1 further comprising means to adjust the relative spacing between the transmitter coil and the receiver coil to thereby tune the coupling therebetween.

9. The probe of claim 7 wherein the transmitter coil is comprised of a single loop of conductor and the receiver coil elements are each comprised of a single loop of conductor.

10. The probe of claim 9 wherein each of said loops is substantially a circle.

11. The probe of claim 2 wherein the transmitter coil is comprised of at least two elements and the current induced by said two elements in the receiver coil is substantially zero.

12. The probe of claim 1 further comprising means for tuning the probe to adjust the amount of coupling between the coils.

13. The probe of claim 12 wherein the probe tuning means comprises means for shifting one coil with respect to the other coil.

14. A multiple antenna surface-coil NMR probe comprising a transmitter coil of generally circular shape and a receiver coil consisting of a pair of oppositely wound, generally circular coil elements, said receiver coil elements being symmetrically disposed about the transmitter coil so that RF energy transmitted from the transmitter coil does not induce substantially any significant current in the receiver coil.

15. The probe of claim 14 further comprising means for tuning the probe to adjust the amount of current induced in said receiver coil by the transmitter coil.

16. The probe of claim 15 wherein said probe tuner means comprises means for adjusting the relative position of one coil with respect to the other coil.

17. A multiple antenna surface-coil NMR probe comprising a transmitter coil consisting of a pair of oppositely wound coil elements, said coil elements being spaced apart from each other, and a receiver coil consisting of a single element, said receiver coil being positioned in a symmetrical location between and non-orthogonally to said transmitter coil elements so that substantially no significant current is induced by the transmitter coil in the receiver coil.

18. A probe for transmitting RF energy in an externally generated magnetic field and sensing a magnetic field induced in a sample by said transmitted RF energy, said probe comprising a transmitter coil and a receiver coil mounted non-orthogonally thereto, each of said coils having a near field radiation pattern of a well defined RF magnetic field, said coils having a specific geometric orientation such that substantially no significant current is induced in one of said coils by the other of said coils as the coils radiate in each other's field and in the presence of said sample.

19. The probe of claim 18 wherein one of said coils has multiple radiating elements.

20. The probe of claim 19 wherein said multiple radiating elements are symmetrically oriented about the other coil.

21. The probe of claim 20 wherein at least some of said elements are oppositely wound from others of said elements.

22. The probe of claim 21 wherein each of said coils are wound with a single loop of conductor.

23. The probe of claim 18 further comprising means for tuning the probe to adjust the amount of current induced in said receiver coil by the transmitter coil.

24. The probe of claim 23 wherein said probe tuner means comprises means for adjusting the relative position of one coil with respect to the other coil.

25. A probe for transmitting RF energy in an externally generated magnetic field and sensing a magnetic field induced in a sample by said transmitted RF energy, said probe comprising a transmitter coil and a receiver coil mounted non-orthogonally thereto, each of said coils having near field radiation pattern of a well defined RF magnetic field, said receiver coil comprising two elements, each of said elements being electrically symmetric so that no significant coupling occurs between said coils as they radiate in each other's fields and in the presence of the sample.

26. A probe for transmitting RF energy in an externally generated magnetic field and sensing a magnetic field induced in a sample by said transmitted RF energy, said probe comprising a transmitter coil and a receiver coils mounted non-orthogonally thereto, each of said coils having a near field radiation pattern of a well defined RF magnetic field, said receiver coil comprising two elements, one of said elements having a greater inductance than the other of said elements, so that no significant coupling occurs between said coils with the transmitter coil positioned closer to the element of lesser inductance as the coils radiate in each other's field and in the presence of the sample.

27. The probe of claim 26 wherein one of said receiver coil elements has a greater number of loops than the other of said receiver coil elements.

28. The probe of claim 26 wherein one of said receiver coil elements is a loop of larger diameter than the other of said receiver elements.

29. A multiple antenna surface-coil NMR probe comprising a transmitter coil of generally circular shape and a receiver coil of oppositely wound, generally circular coil elements, one of said receiver coil elements comprising a single loop of conductor and the other of said receiver coil elements comprising a plurality of loops of conductor, the transmitter coil being positioned closer to the single loop receiver coil element so that RF energy transmitted from the transmitter coil does not induce substantially any significant current in the receiver coil.

30. A multiple antenna surface-coil NMR probe comprising a transmitter coil of generally circular shape and a receiver coil of oppositely wound, generally circular coil elements, one of said receiver coil elements having a greater diameter than the other of said receiver coil elements, the transmitter coil being positioned closer to the smaller coil element so that RF energy transmitted from the transmitter coil does not induce substantially any significant current in the receiver coil.

31. The probe of claim 25 further comprising means for tuning the probe to adjust the amount of current induced in said receiver coil by the transmitter coil.

32. The probe of claim 31 wherein said probe tuner means comprises means for adjusting the relative position of one coil with respect to the other coil.

* * * * *